(12) United States Patent　　(10) Patent No.:　　US 8,281,484 B2
Lan et al.　　(45) Date of Patent:　　Oct. 9, 2012

(54) PICK-UP JIG

(75) Inventors: Rong-Qin Lan, Guang-Dong (CN);
Li-Jun Xu, Guang-Dong (CN)

(73) Assignee: Cheng UEI Precision Industry Co., Ltd., Tu-Cheng, Taipei Hsien (TW)

( * ) Notice: Subject to any disclaimer, the term of this patent is extended or adjusted under 35 U.S.C. 154(b) by 2 days.

(21) Appl. No.: 12/980,197

(22) Filed: Dec. 28, 2010

(65) Prior Publication Data

US 2012/0159775 A1　　Jun. 28, 2012

(51) Int. Cl.
*H01R 43/00* (2006.01)

(52) U.S. Cl. ............... 29/764; 29/278; 29/729; 29/750; 439/495

(58) Field of Classification Search .............. 29/729, 29/739, 747–751, 758, 874, 876; 439/495
See application file for complete search history.

(56) References Cited

U.S. PATENT DOCUMENTS 3,845,535 A * 11/1974 Over ............................ 29/56.6
4,155,159 A *  5/1979 Hogan et al. ................. 29/764
5,474,468 A * 12/1995 Chishima et al. ............. 439/495
5,549,485 A *  8/1996 Chishima et al. ............. 439/495
6,280,240 B1 *  8/2001 Chang ........................... 439/495
6,790,073 B2 *  9/2004 Wu ................................ 439/495
7,077,690 B2 *  7/2006 Zhang et al. .................. 439/495
7,275,313 B2 * 10/2007 Ichida et al. .................... 29/747
7,625,232 B2 * 12/2009 Lin et al. ....................... 439/495

* cited by examiner

*Primary Examiner* — Minh Trinh
(74) *Attorney, Agent, or Firm* — Cheng-Ju Chiang

(57) ABSTRACT

A pick-up jig is adapted to be dismountably mounted to an electronic component which has two buckling blocks. The pick-up jig includes a pick-up board and two buckling arms. The pick-up board is against a top of the electronic component. The pick-up board has a flat top surface for the convenience of the pick-up jig being picked up by a SMT machine. The two buckling arms perpendicularly extend downward from two opposite ends of a bottom surface of the pick-up board. An inside of each of the buckling arms protrude inward to form two blocking pillars spaced from each other to define a fastening groove therebetween. A buckling hook is protruded at a bottom of the buckling arm. The buckling blocks slide over the corresponding buckling hooks to be buckled in the corresponding fastening grooves and the buckling hook grappling a bottom of the corresponding buckling block.

4 Claims, 4 Drawing Sheets

PICK-UP JIG

BACKGROUND OF THE INVENTION

1. Field of the Invention

The present invention relates to a pick-up jig, and more particularly to a pick-up jig adapted to be mounted to an electronic component for assisting the electronic component to be surface mounted onto a printed circuit board.

2. The Related Art

When assembling an electronic component on a circuit board by surface mounting technology (SMT), it's difficult for a SMT machine to surface mount the electronic components which have various unmatchable shapes with the suction nozzle of the SMT machine onto the circuit board directly. So a pick-up jig matched with the suction nozzle of the SMT machine is needed, to assist the electronic component to be surface mounted on the circuit board.

However, the electronic component picked up by the foregoing pick-up jig is often apt to randomly sway in the process of the SMT machine shifting the pick-up jig, and even some electronic components may fall off from the pick-up jig, so that often result in inaccurate assembly between the electronic component and the circuit board. Furthermore, it is difficult to take out the electronic component from the pick-up jig.

SUMMARY OF THE INVENTION

An object of the present invention is to provide a pick-up jig adapted to be dismountably mounted to an electronic component for assisting the electronic component to be picked up by a SMT machine and then surface mounted on a printed circuit board. The electronic component has two buckling blocks protruded oppositely from two sides thereof. The pick-up jig includes a pick-up board and two buckling arms. The pick-up board is mounted on the electronic component against a top of the electronic component. The pick-up board has a flat top surface for the convenience of the pick-up jig being picked up by the SMT machine. The two buckling arms perpendicularly extend downward from two opposite ends of a bottom surface of the pick-up board to clip the electronic component therebetween. An inside of each of the buckling arms protrude inward to form two blocking pillars each extending along the extension direction of the buckling arm. The two blocking pillars are spaced from each other to define a fastening groove therebetween. A buckling hook is protruded at a bottom of the buckling arm and beyond the inside of the buckling arm to project under the fastening groove. The buckling blocks slide over the corresponding buckling hooks to be buckled in the corresponding fastening grooves and the buckling hook grappling a bottom of the corresponding buckling block.

As described above, the pick-up jig according to the present invention can firmly pick up the electronic component thereto by means of the buckling blocks being received in the fastening grooves, the buckling hooks grappling the bottoms of the buckling blocks. So the pick-up jig can prevent the electronic component from randomly swaying and even falling off in the process of the SMT machine shifting the pick-up jig, so as to make the electronic component accurately surface mounted onto the printed circuit board.

BRIEF DESCRIPTION OF THE DRAWINGS

The present invention will be apparent to those skilled in the art by reading the following description, with reference to the attached drawings, in which.

DETAILED DESCRIPTION OF THE PREFERRED EMBODIMENT

Figure 3:
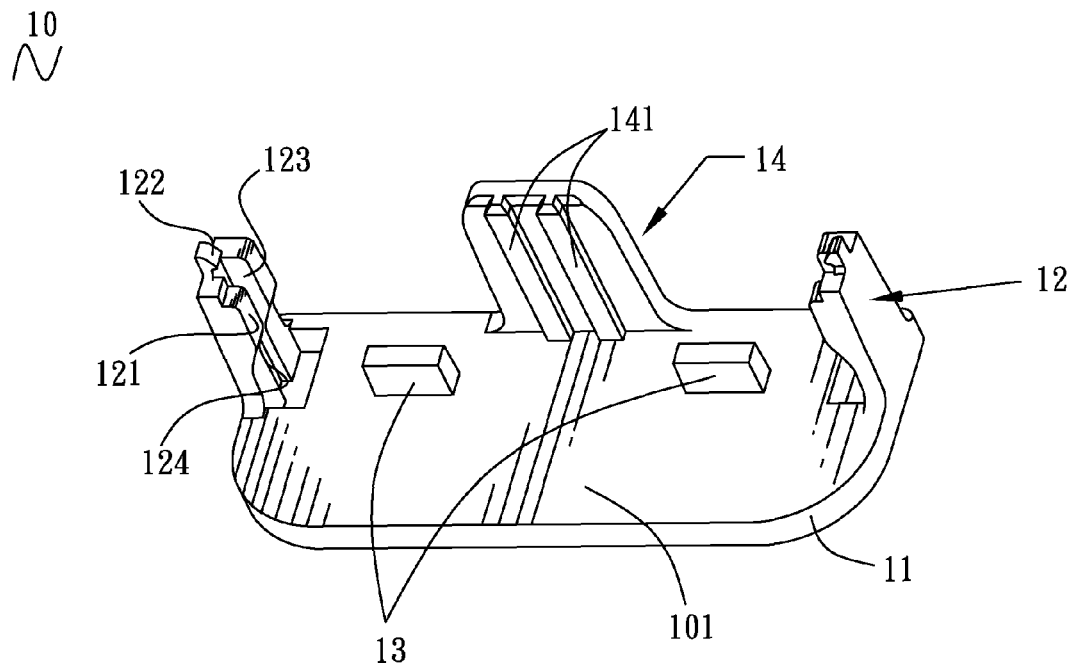
FIG. 3 is a perspective view of a pick-up jig according to the present invention.
Figure 5:
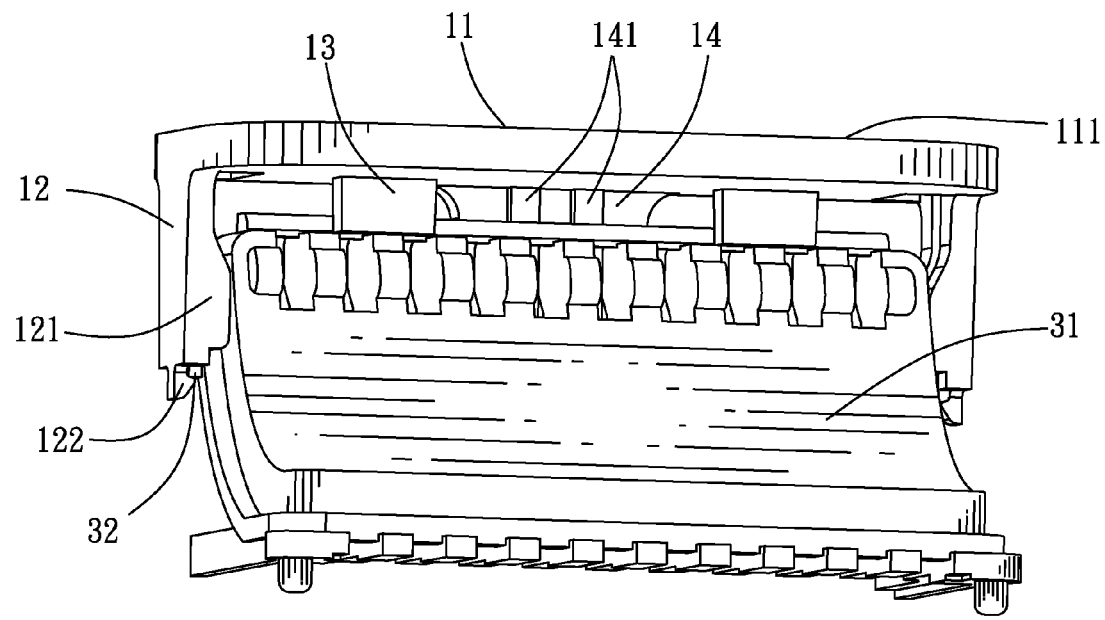
FIG. 5 is an assembled perspective view showing that the pick-up jig of FIG. 3 is mounted to the electronic component of FIG. 1.

Referring to FIG. 3 and FIG. 5, a pick-up jig 10 according to an embodiment of the present invention is adapted to be dismountably mounted to an electronic component 30 for assisting the electronic component 30 to be picked up by a SMT machine (not shown) and then surface mounted on a printed circuit board (not shown).

Figure 1:
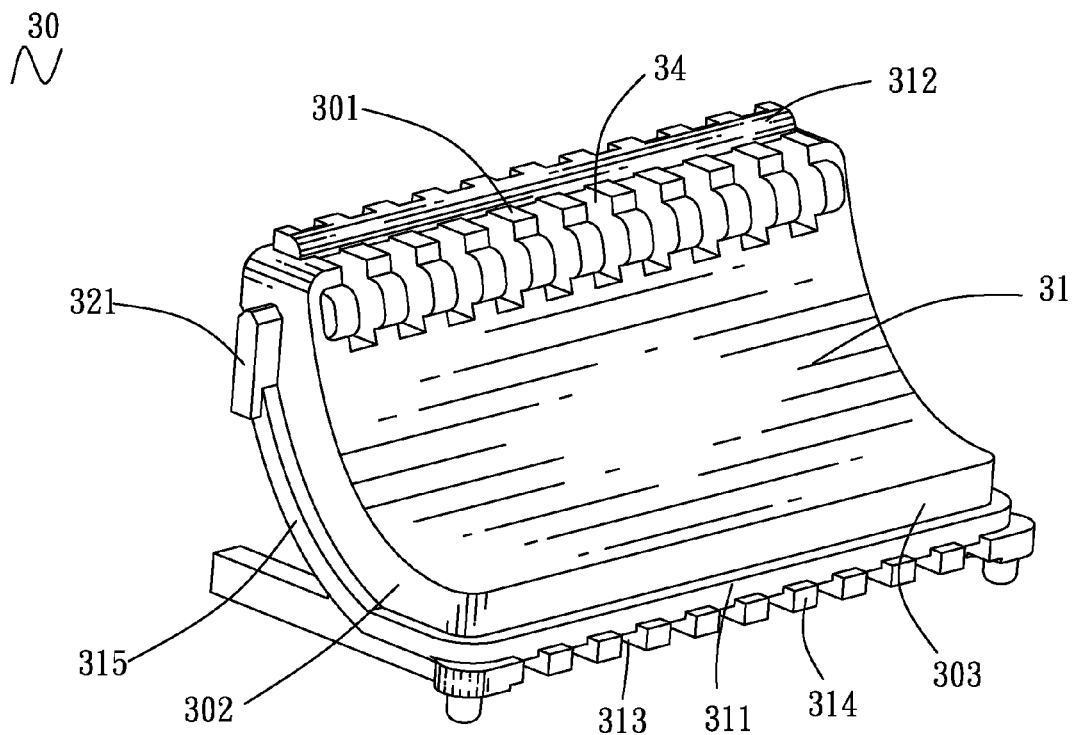
FIG. 1 is a perspective view of an electronic component in accordance with an embodiment of the present invention.
Figure 2:
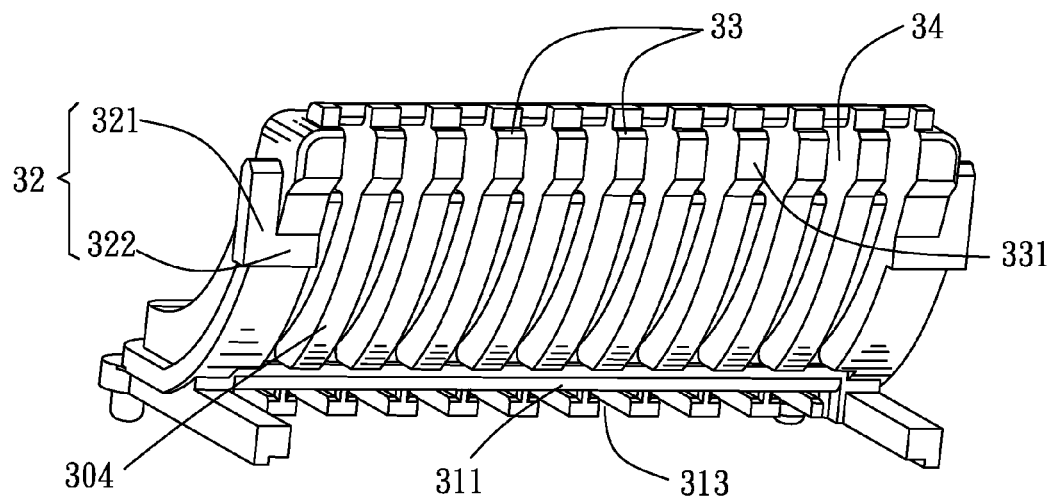
FIG. 2 is a perspective view of the electronic component of FIG. 1 viewed from another angle.

Referring to FIG. 1 and FIG. 2, an embodiment of the electronic component 30 is shown. The electronic component 30 has a dielectric body 31 of an arced shape viewed from a lateral view. A rectangular contact board 311 is attached to a bottom of one end of the dielectric body 31 along a substantial tangent direction of the dielectric body 31. Two opposite ends and a front side of the contact board 311 are further beyond two lateral surfaces 302 and a front surface 303 of the dielectric body 31. A bottom of the contact board 311 protrudes downward to form a rectangular protrusion 314 with a front edge thereof hooking the front side of the contact board 311. The protrusion 314 defines a plurality of passages 313 each extending longitudinally to penetrate through the protrusion 314.

Referring to FIG. 1 and FIG. 2 again, two L-shaped buckling blocks 32 are protruded at two sides of the dielectric body 31. Each of the buckling blocks 32 has a first arm 321 protruded outward from a top of the lateral surface 302 of the dielectric body 31 and substantially extending vertically, and a second arm 322 extending levelly to a rear surface 304 of the dielectric body 31. Two flanges 315 are protruded oppositely from the two lateral surfaces 302 of the dielectric body 31 and each is connected between a bottom of the buckling block 32 and one end of the contact board 311. A rear of a top surface 301 of the other end of the dielectric body 31 protrudes upward to form a blocking wall 312 extending transversely. A top of the rear surface 304 of the dielectric body 31 protrudes rearward to form a rectangular locating block 33 extending transversely and adjacent to the blocking wall 312. The locating block 33 has a touching surface 331 at a rear thereof. The rear surface 304 of the dielectric body 31 defines a plurality of terminal grooves 34 arranged at regular intervals along a transverse direction thereof and each further extending to penetrate through the locating block 33, a rear of the blocking wall 312 and a front of the top surface 301. A bottom of each of the terminal grooves 34 reaches the contact board 311. A plurality of terminals (not shown) are restrained in the terminal grooves 34 and further exposed out from the passages 313, respectively.

Figure 4:
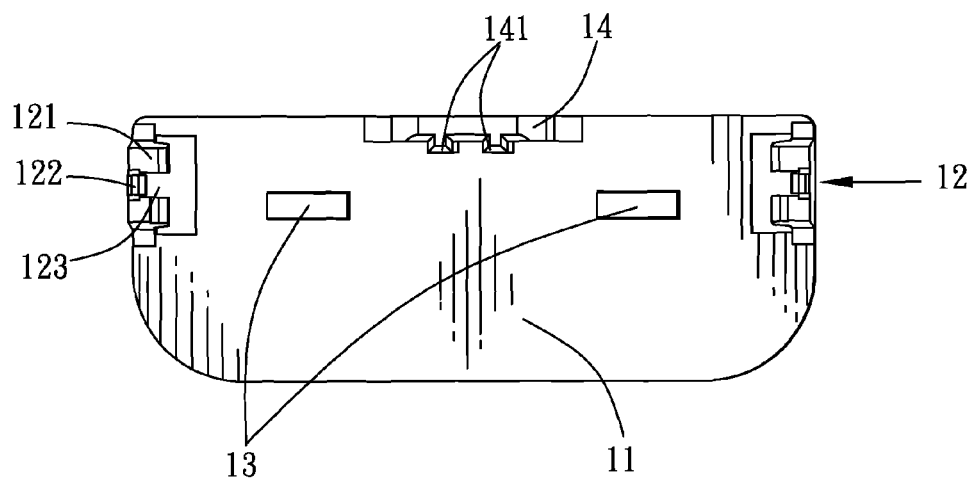
FIG. 4 is an upward view of the pick-up jig of FIG. 3.

Referring to FIG. 3 and FIG. 4, the pick-up jig 10 includes a pick-up board 11. The pick-up board 11 is of a substantially rectangular shape and has a flat top surface 111 for convenience of the pick-up jig 10 being picked up by the SMT machine. Two buckling arms 12 perpendicularly extend downward from two opposite ends of a bottom surface 101 of the pick-up board 11 to clip the electronic component 30 therebetween. The bottom surface 101 of the pick-up board 11 further protrudes downward to form two rectangular touching blocks 13 spaced from each other and aligned with each other between the buckling arms 12. A blocking board 14 is perpendicularly protruded downward from a middle of a rear side of the bottom surface 101 of the pick-up board 11. Two sides of an inner surface 124 of each buckling arm 12 protrude inward to form two ladder-shaped blocking pillars 121 each extending along the extension direction of the buckling arm 12. The two blocking pillars 121 are spaced from each other to define a fastening groove 123 therebetween. A middle of a bottom of each buckling arm 12 protrudes inward to form a buckling hook 122 beyond the inner surface 124 of the buckling arm 12 to project under the fastening groove 123. A bottom face of the buckling hook 122 is acted as a guiding face 1221 inclined towards the fastening groove 123 and a top face of the buckling hook 122 facing the fastening groove 123 is acted as a propping face 1222 slightly inclined towards the guiding face 1221 and smoothly connected with the guiding face 1221. Two portions of a front surface of the blocking board 14 protrude frontward to form two ribs 141 spaced from each other and each extending vertically to the bottom surface 101 of the pick-up board 11.

Figure 6:
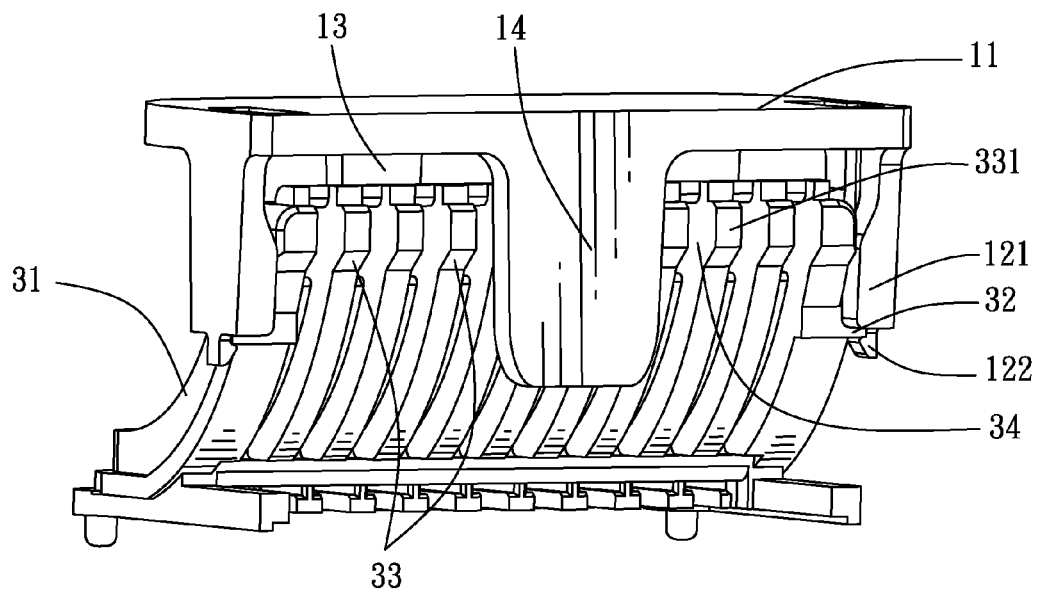
FIG. 6 is another angle of assembled perspective view showing that the pick-up jig of FIG. 3 is mounted to the electronic component of FIG. 1.
Figure 7:
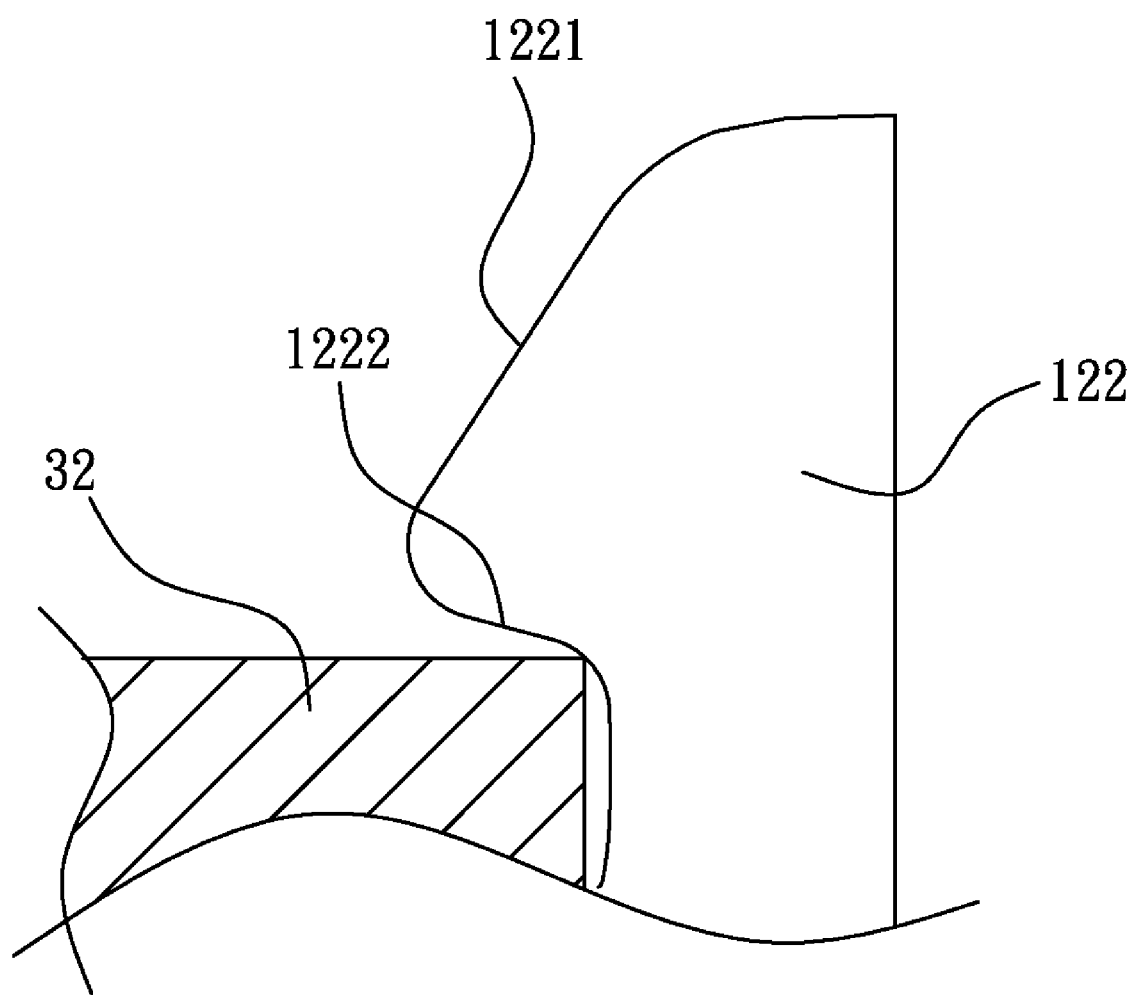
FIG. 7 is an enlarged perspective view in part showing that a buckling hook of the pick-up jig of FIG. 3 grapples a buckling block of the electronic component of FIG. 1.

Referring to FIG. 5, FIG. 6 and FIG. 7, when the pick-up jig 10 is mounted to the electronic component 30 in a process of surface mounting, the pick-up jig 10 is pressed downwardly towards the electronic component 30 to make the first arms 321 of the buckling blocks 32 slide into the fastening grooves 123 along the guiding faces 1221. Then the buckling hooks 122 grapple the bottoms of the corresponding buckling blocks 32. Bottoms of the touching blocks 13 abut on the top surface 301 of the electronic component 30 to strengthen the pick-up board 11. The touching blocks 13 further abut against a front of the blocking wall 312. The blocking board 14 abuts against the touching surface 331 of the electronic component 30 and the ribs 141 are partially received in the corresponding terminal grooves 34. So the electronic component 30 can be firmly picked up by the pick-up jig 10 to avoid randomly swaying in the process of the SMT machine (not shown) shifting the pick-up jig 10. After the electronic component 30 is surface mounted onto the printed circuit board (not shown), the pick-up jig 10 is lift upward to make the electronic component 30 fall off from the pick-up jig 10 under the guidance of the propping faces 1222 of the buckling hooks 122.

As described above, the pick-up jig 10 according to the present invention can firmly pick up the electronic component 30 thereto by means of the buckling blocks 32 being received in the fastening grooves 123, the buckling hooks 122 grappling the bottoms of the buckling blocks 32 and the touching blocks 13 abutting on the top surface 301 of the electronic component 30. So the pick-up jig 10 can prevent the electronic component 30 from randomly swaying and even falling off in the process of the SMT machine (not shown) shifting the pick-up jig 10, so as to make the electronic component 30 accurately surface mounted onto the printed circuit board (not shown). Furthermore, the buckling blocks 32 slide into the fastening grooves 123 along the guiding faces 1221 and fall off from the fastening grooves 123 along the propping faces 1222 so that make the mount-dismount operation between the pick-up jig 10 and the electronic component 30 more convenient.

What is claimed is:

1. A pick-up jig adapted to be dismountably mounted to an electronic component for assisting the electronic component to be picked up by a SMT (Surface Mounting Technology) machine and then surface mounted on a printed circuit board, the electronic component having two buckling blocks protruded oppositely from two sides thereof, the pick-up jig comprising:

a pick-up board mounted on the electronic component against a top of the electronic component, the pick-up board having a flat top surface for convenience of the pick-up jig being picked up by the SMT machine;

two buckling arms perpendicularly extending downward from two opposite ends of a bottom surface of the pick-up board to clip the electronic component therebetween, an inside of each of the buckling arms protruding inward to form two blocking pillars each extending along an extension direction of the buckling arm, the two blocking pillars being spaced from each other to define a fastening groove therebetween, a buckling hook being protruded at a bottom of the buckling arm and beyond the inside of the buckling arm to project under the fastening groove, the buckling blocks sliding over the corresponding buckling hooks to be buckled in the corresponding fastening grooves and the buckling hook grappling a bottom of the corresponding buckling block; and a blocking board perpendicularly protruding downward from a rear of the bottom surface of the pick-up board to abut against a rear surface of the electronic component, wherein a front surface of the blocking board protrudes frontward to form two ribs spaced from each other and each extending vertically, the rear surface of the electronic component defines a plurality of terminal grooves, and the ribs are partially restrained in the corresponding terminal grooves.

2. The pick-up jig as claimed in claim 1, wherein a bottom face of the buckling hook is acted as a guiding face inclined towards the fastening groove and a top face of the buckling hook facing the fastening groove is acted as a propping face slightly inclined towards the guiding face and smoothly connected with the guiding face, the buckling block slides into the fastening groove along the guiding face and falls off from the fastening groove along the propping face.

3. A pick-up jig adapted to be dismountably mounted to an electronic component for assisting the electronic component to be picked up by a surface mounting technology (SMT) machine and then surface mounted on a printed circuit board, the electronic component having two buckling blocks protruded oppositely from two sides thereof, the pick-up jig comprising:

a pick-up board mounted on the electronic component against a top of the electronic component, the pick-up board having a flat top surface for convenience of the pick-up jig being picked up by the SMT machine;

two buckling arms perpendicularly extending downward from two opposite ends of a bottom surface of the pick-up board to clip the electronic component therebetween, an inside of each of the buckling arms protruding inward to form two blocking pillars each extending along an extension direction of the buckling arm, the two blocking pillars being spaced from each other to define a fastening groove therebetween, a buckling hook being protruded at a bottom of the buckling arm and beyond the inside of the buckling arm to project under the fastening groove, the buckling blocks sliding over the corresponding buckling hooks to be buckled in the corresponding fastening grooves and the buckling hook grappling a bottom of the corresponding buckling block; and a plurality of touching blocks which perpendicularly protrude downward from the bottom surface of the pick-up board and are spaced from one another, the touching blocks abutting on a top surface of the electronic component to strengthen the pick-up board.

4. The pick-up jig as claimed in claim 3, wherein a rear of the top surface of the electronic component protrudes upward to form a blocking wall extending transversely, the touching blocks further abut against a front of the blocking wall.

\* \* \* \* \*